(12) United States Patent
Donaher

(10) Patent No.: US 8,760,624 B2
(45) Date of Patent: Jun. 24, 2014

(54) SYSTEM AND METHOD FOR ESTIMATING FIELD CURVATURE

(75) Inventor: J. Casey Donaher, Westford, MA (US)

(73) Assignee: Rudolph Technologies, Inc., Flanders, NJ (US)

( * ) Notice: Subject to any disclaimer, the term of this patent is extended or adjusted under 35 U.S.C. 154(b) by 482 days.

(21) Appl. No.: 12/837,941

(22) Filed: Jul. 16, 2010

(65) Prior Publication Data

US 2012/0015460 A1    Jan. 19, 2012

(51) Int. Cl.
| | |
|---|---|
| *G03B 27/32* | (2006.01) |
| *G03B 27/42* | (2006.01) |
| *G03B 27/52* | (2006.01) |
| *G03B 27/54* | (2006.01) |
| *G03B 27/74* | (2006.01) |
| *G03F 7/20* | (2006.01) |
| *G03F 9/00* | (2006.01) |

(52) U.S. Cl.
CPC ........ *G03F 7/70666* (2013.01); *G03F 7/70641* (2013.01); *G03F 9/7026* (2013.01)
USPC .................. 355/55; 355/53; 355/67; 355/68; 355/77

(58) Field of Classification Search
CPC ... G03F 7/70; G03F 7/70641; G03F 7/70666; G03F 9/70; G03F 9/7026
USPC ................. 355/52–53, 55, 61, 67–68, 71, 77; 356/399–401, 614–624; 438/16
See application file for complete search history.

(56) References Cited

U.S. PATENT DOCUMENTS

| | | | |
|---|---|---|---|
| 5,581,075 A | 12/1996 | Naraki et al. | |
| 5,657,130 A | 8/1997 | Shirasu et al. | |
| 5,914,774 A | 6/1999 | Ota | |
| 5,991,004 A | 11/1999 | Wallace et al. | |

(Continued)

FOREIGN PATENT DOCUMENTS

| | | |
|---|---|---|
| EP | 1341044 A2 | 9/2003 |
| EP | 1950793 A1 | 7/2008 |

OTHER PUBLICATIONS

Invitation to Pay Additional Fees and, Where Applicable, Protest Fee, PCT/US2011/043121, date of mailing Oct. 12, 2011.

(Continued)

*Primary Examiner* — Toan Ton
*Assistant Examiner* — Colin Kreutzer
(74) *Attorney, Agent, or Firm* — Wolff & Samson, PC

(57) ABSTRACT

Projection systems and methods with mechanically decoupled metrology plates according to embodiments of the present invention can be used to characterize and compensate for misalignment and aberration in production images due to thermal and mechanical effects. Sensors on the metrology plate measure the position of the metrology plate relative to the image and to the substrate during exposure of the substrate to the production image. Data from the sensors are used to adjust the projection optics and/or substrate dynamically to correct or compensate for alignment errors and aberration-induced errors. Compared to prior art systems and methods, the projection systems and methods described herein offer greater design flexibility and relaxed constraints on mechanical stability and thermally induced expansion. In addition, decoupled metrology plates can be used to align two or more objectives simultaneously and independently.

21 Claims, 15 Drawing Sheets

(56) References Cited

U.S. PATENT DOCUMENTS

| | | | |
|---|---|---|---|
| 6,320,644 | B1 | 11/2001 | Simpson et al. |
| 6,323,935 | B1 | 11/2001 | Ebihara et al. |
| 6,483,572 | B2 | 11/2002 | Simpson et al. |
| 7,301,646 | B2 | 11/2007 | Wegmann et al. |
| 7,385,671 | B2 | 6/2008 | Gardner et al. |
| 2002/0041377 | A1* | 4/2002 | Hagiwara et al. ............. 356/399 |
| 2005/0264777 | A1 | 12/2005 | Gardner |
| 2007/0139635 | A1 | 6/2007 | Binnard et al. |
| 2008/0074629 | A1 | 3/2008 | Groeneveld et al. |
| 2009/0201513 | A1 | 8/2009 | Shibazaki |
| 2012/0015461 | A1 | 1/2012 | Donaher |

OTHER PUBLICATIONS

Raab, E.L., et al., "Analyzing Deep-UV Lens Aberrations Using Aerial Image and Latent Image Metrologies," Proceedings of SPIE, 2197: 550-565 (1994).

PCT/US2011/043121: Notification of Transmittal of the International Search Report and the Written Opinion of the International Searching Authority, or the Declaration dated Feb. 17, 2012.

"Notification Concerning Transmittal of International Preliminary Report on Patentability (Chapter I of the Patent Cooperation Treaty)" from International Application No. PCT/US2011/043121 mailed on Jan. 31, 2013.

* cited by examiner

SYSTEM AND METHOD FOR ESTIMATING FIELD CURVATURE

BACKGROUND OF THE INVENTION

In photolithography systems, projection optics form an image of an illuminated object, such as a reticle, on a substrate, such as a semiconductor wafer or flat panel display substrate, that is coated with a photoresist. Illuminating the photoresist to expose the substrate, then etching the exposed substrate causes a pattern to form on the substrate that mimics the image with a resolution determined by the optical system and the size of the features on the reticle. At present, the desired feature size for applications in the semiconductor and flat panel display industries is under three microns and continues to shrink.

Even minute changes in the relative positions and attitudes of the reticle, lens, and substrate can adversely affect the image quality. In mechanically stable systems, heating and cooling of the lens by the illumination source may be the largest source of error. During exposure, the lens absorbs some of the light from the illumination source, causing changes in both the refractive indices and shapes of the optical elements in the lens, which, in turn, shift the focal plane away from the surface of the substrate. At the high doses used in some processes, the focal plane can shift significantly during a single exposure, blurring the image recorded in the photoresist.

Prior systems compensate for focal plane shift using more stable structures, more frequent calibration, and more interferometric measurements. For example, metal blocks can be used to compensate, actively and passively, for expansion or contraction in the lens and lens supports. As the blocks change temperature, either because they absorb incident light or are actively heated or cooled, they expand and contract to offset simultaneous expansion and contraction of the lens. Thermal compensation can also be used with models of focal plane shift derived from calibration data or with interferometric measurements of the relative positions of the substrate and the lens. Unfortunately, thermal compensation is slow, and interferometric measurement requires bulky equipment and optical access to the substrate or the substrate stage. In addition, factors besides thermal gradients, such as changes in atmospheric pressure, can cause focus changes without changing field curvature and astigmatism.

Alternatively, changes in focus can be measured and corrected (or compensated) using alignment marks, or fiducial marks, to determine the relative locations of the focal plane and the substrate. U.S. Pat. No. 5,991,004 to Wallace et al., incorporated herein by reference in its entirety, describes using sensors and gratings to measure defocus in photolithographic systems due to thermal effects. The Wallace system images a first grating in an object plane of the lens onto a second grating in an image plane of the lens. A relay lens images the second grating onto a detector, which records a Moiré pattern with a fringe spacing determined by the periods of the first and second gratings.

In the Wallace system, tilting the second grating about its center with respect to the image plane moves the edges of the second grating out of the lens's depth of field. As a result, if the lens focus is at the image plane, then the Moiré pattern appears only at the middle of the detector because the edges of the second grating are out of focus. As the focus shifts towards or away from the image plane, the Moiré pattern shifts left or right, depending on which way the second grating is tilted. Although this is a simple way of measuring defocus in real time, monitoring focus change in this way at only one radius in the field does not ensure determination of higher-order aberrations, such as astigmatism and field curvature. In addition, the gratings are not on the reticle or the substrate, so they must be registered precisely to the reticle and the substrate to track defocus accurately.

U.S. Pat. No. 7,301,646 to Wegmann et al., incorporated herein by reference in its entirety, extends the use of periodic structures and substructures to measure astigmatism and Petzval surface position. Like the Wallace system, the Wegmann system includes gratings at the object and image planes, respectively, of a projection lens. In the Wegmann system, however, there are four pairs of gratings, each of which is oriented in a different direction (e.g., x, y, and ±45°). Measuring the phase of the wavefront transmitted through a particular pair of gratings yields a wavefront whose phase depends, in part, on aberrations due to thermal effects on the lens.

Unlike Wallace, Wegmann's gratings are printed on the reticle and imaged through the plane of the substrate. This complicates the design because either or both the production pattern to be printed and the substrate interfere with the optical and mechanical design. In addition, the cameras used to image the gratings must remain stable between and during measurements. If the camera drifts between measurements, then it will record an image that is shifted due to misalignment of the camera (plus any misalignment of the object and image planes).

U.S. Pat. Nos. 6,320,644 and 6,483,572, both to Simpson et al. and incorporated herein by reference in their entireties, describe alignment methods that eliminate the effects of camera misalignment. In the Simpson patents, alignment involves projecting fiducial marks on or embedded in the reticle through a lens system. The images of the fiducial marks on a reticle are detected with a camera mounted to a metrology plate that is coupled to the lens system. Because the camera is mechanically coupled to the lens, it is always aligned properly to the lens, provided that the mechanical coupling is stable. As a result, aligning the camera to the reticle also aligns the lens to the reticle. The fiducial marks, camera, and/or lens must be aligned to the substrate, however, for the substrate to be aligned to the reticle. In addition, fixing the camera (and the metrology plate) to the lens limits the flexibility of the system by increasing the bulk and mass of the lens assembly.

SUMMARY OF THE INVENTION

Embodiments of the present invention include a projection system and corresponding method for estimating a position of an image relative to a substrate. Examples of the projection system include projection optics, which may include one or more objectives, configured to project image(s) of one or more objects. A metrology plate disposed between the projection optics and the substrate supports first and second sensors that are configured to sense the positions of the metrology plate relative to the substrate and the image, respectively. Together, the sensors and the metrology plate form a system metrology core that can be used to locate and match the image to the substrate surface. Example methods and apparatus for estimating image plane position may be used to fabricate semiconductor devices, such as computer chips and thin-film transistor displays, for use in electronics, including, but not limited to, cell phones, personal digital assistants, computers, solar cells, and other electronic devices.

Because the metrology plate is mechanically decoupled from the projection optics (and may be mechanically decoupled from the substrate as well), the metrology plate, surface plane, and image plane can move relative to each other. The sensors provide indications of this movement to a processor, which estimates a position of the image relative to the surface based on the positions of the metrology plate relative to the surface and the image.

Mechanically decoupling the metrology plate (system metrology core) from the projection optics allows simultaneous formation and accurate coordination of multiple images on a single substrate. For example, decoupled metrology plates can be used to estimate the positions of images associated with two or more projection optics relative to the surface of a single substrate. In addition, mechanically decoupling the metrology plate from the projection optics provides added design flexibility, including space for additional sensors, and relaxes constraints on expansion/contraction of components due to heating, etc.

Fundamentally, a decoupled metrology plate (system metrology core) allows greater design flexibility to make a super-stable, robust reference base for all the important coordinate systems in the system. It eases stability tolerances on other subsystems and structures, such as the camera/lens. Also, the mass and weight distribution needed to create a suitably stable metrology plate could have a detrimental effect if mounted to the camera or objective; the decoupled metrology plate according to this embodiment of the invention enables stability without negatively impacting other system components.

Further embodiments include an apparatus and corresponding method for estimating field curvature of an image that can be used with or without a mechanically decoupled metrology plate. One or more sensors detect the sagittal and tangential foci of the image associated with a substrate, possibly during exposure of the substrate. The sensors may be disposed on a decoupled metrology plate, like the ones described herein. A processor coupled to the sensors uses information about the sagittal and tangential foci to estimate the field curvature of the image. The processor may also use calibration data acquired before exposure to compute or refine the estimate of field curvature. Servos compensate for the estimated field curvature and astigmatism by matching an upper surface of the substrate to a best-fit plane associated with the actual image surface. As above, example methods and apparatus for estimating field curvature may be used to fabricate semiconductor devices, such as computer chips and thin-film transistor displays, for use in electronics, including, but not limited to, cell phones, personal digital assistants, computers, solar cells, and other electronic devices.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1A:
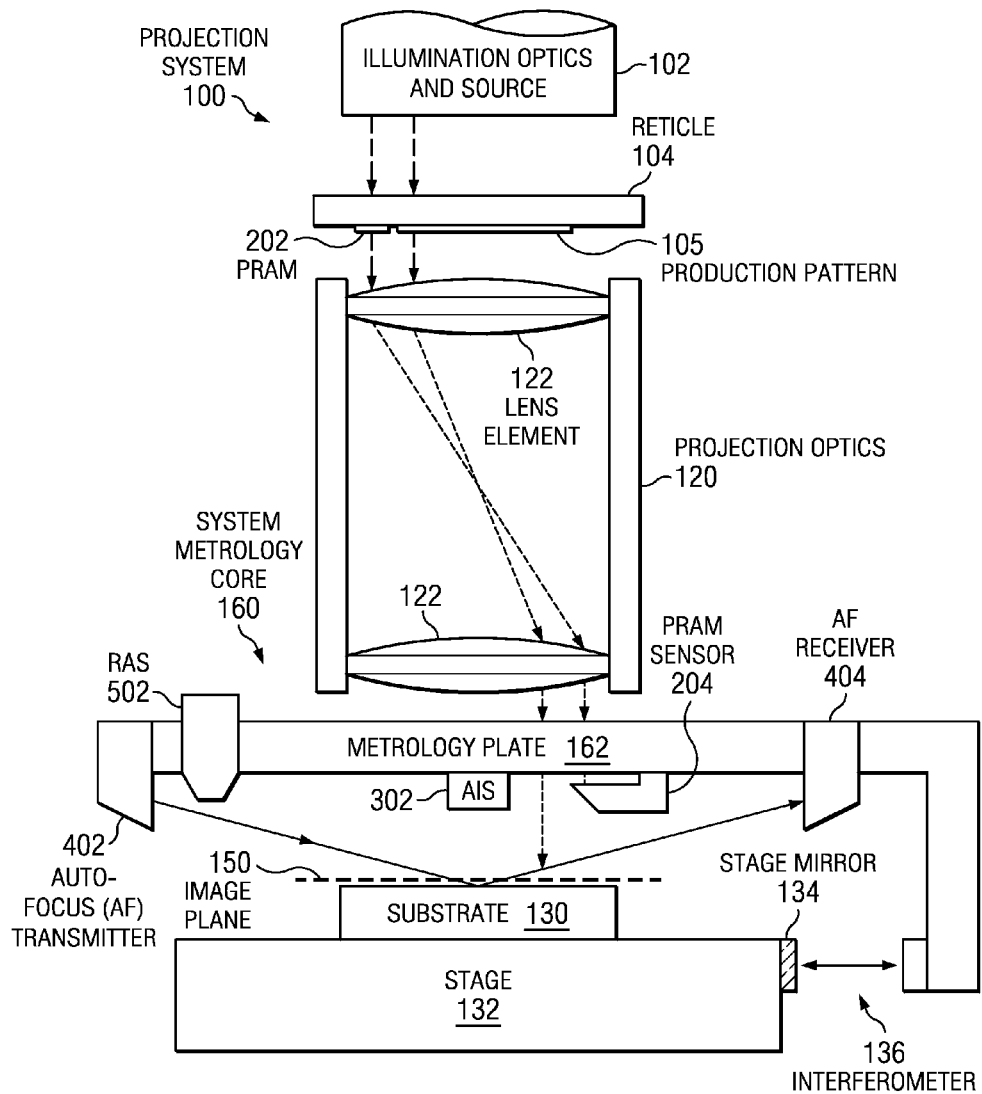
FIGS. 1A and 1B are elevation views of a projection system according to embodiments of the present invention.
Figure 1B:
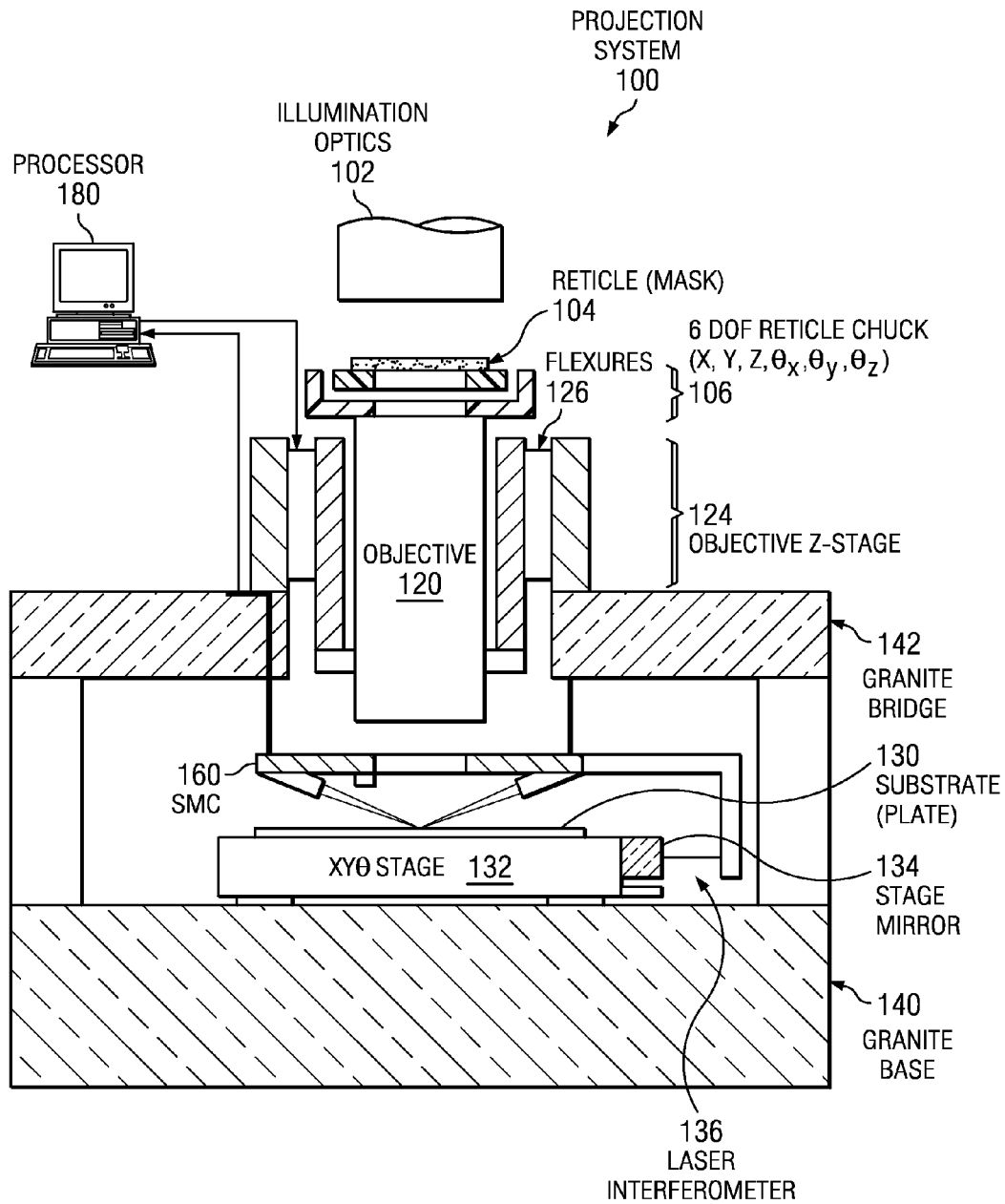

FIGS. 1A and 1B show a projection system 100 that can be used to pattern a substrate 130, such as a wafer of semiconductor or a piece of glass, with a production pattern 105 on a reticle 104. Projection optics 120 image the production pattern 105 from the reticle 104, which is illuminated by an illumination source 102, to an image 150. Turning on the illumination source 102 exposes photoresist (not shown) on the substrate 130 to a dose of illumination in the image of the production pattern 104. After exposure, the production pattern 105 may be exchanged for a different pattern by switching the reticle 104 and/or the substrate 130 may be replaced or moved to a new location with a stage 132.

Ideally, the image 150 is coincident with one of the surfaces of the substrate 130. If the substrate 130 is a piece of glass coated with indium tin oxide (ITO) and photoresist, for example, the image may be coincident with the upper or lower surface of the photoresist. Alternatively, the image may be projected to a surface that defines the boundary between layers coated onto the substrate 130, such as layer deposited on a silicon or gallium arsenide wafer. In practice, the image 150 drifts with respect to the substrate 130 due to lens heating, vibrations, and other environmental perturbations, degrading the resolution of the image patterned into the substrate 130 during exposure. Aberrations in the projection optics 120, including those induced by heating, may cause the image 150 to warp or change shape, further degrading the image quality.

Sensors on a metrology plate 162 detect the locations of the image 150 and the upper surface of the substrate 130 so that any misalignment and distortion can be corrected and/or compensated. An aerial image sensor (AIS) 302 detects the location of the image 150 relative to the metrology plate 162 and may also sense the shape of the image 150. Similarly, a projected reticle alignment mark (PRAM) sensor 204 measures transverse alignment of a PRAM 202 on the reticle 104 to give an indication of the transverse position of the image 150 with respect to the metrology plate 162. The metrology plate 162 also accommodates two sensors that measure the alignment of the metrology plate 162 to the substrate 130: (1) a reflective alignment system (RAS) 502 and (2) an autofocus system made up of an autofocus transmitter 402 and an autofocus receiver 404.

Together, the metrology plate 162, AIS 302, PRAM sensor 204, autofocus transmitter 402, autofocus receiver 404, RAS 502, and interferometer 136 form a system metrology core 160 that floats free of the projection optics 120. The system metrology core 160 and metrology plate 162 may also be mechanically decoupled from the substrate stage 132, as shown in FIGS. 1A and 1B. As shown in FIG. 1B, the system metrology core 160 is suspended from a granite bridge 142, which, in turn, is supported by a granite base 140 that also supports the stage 132. Although the granite bridge 142 is also coupled to the projection optics 120 via a column stage 124 and flexures 126, the projection optics 120 and the system metrology core 160 (metrology plate 162) are not mechanically coupled to each other. Instead, the flexures 126 allow the projection optics 120 to be moved relative to the other elements in the projection system 100 using the column stage 124.

Figure 1C:
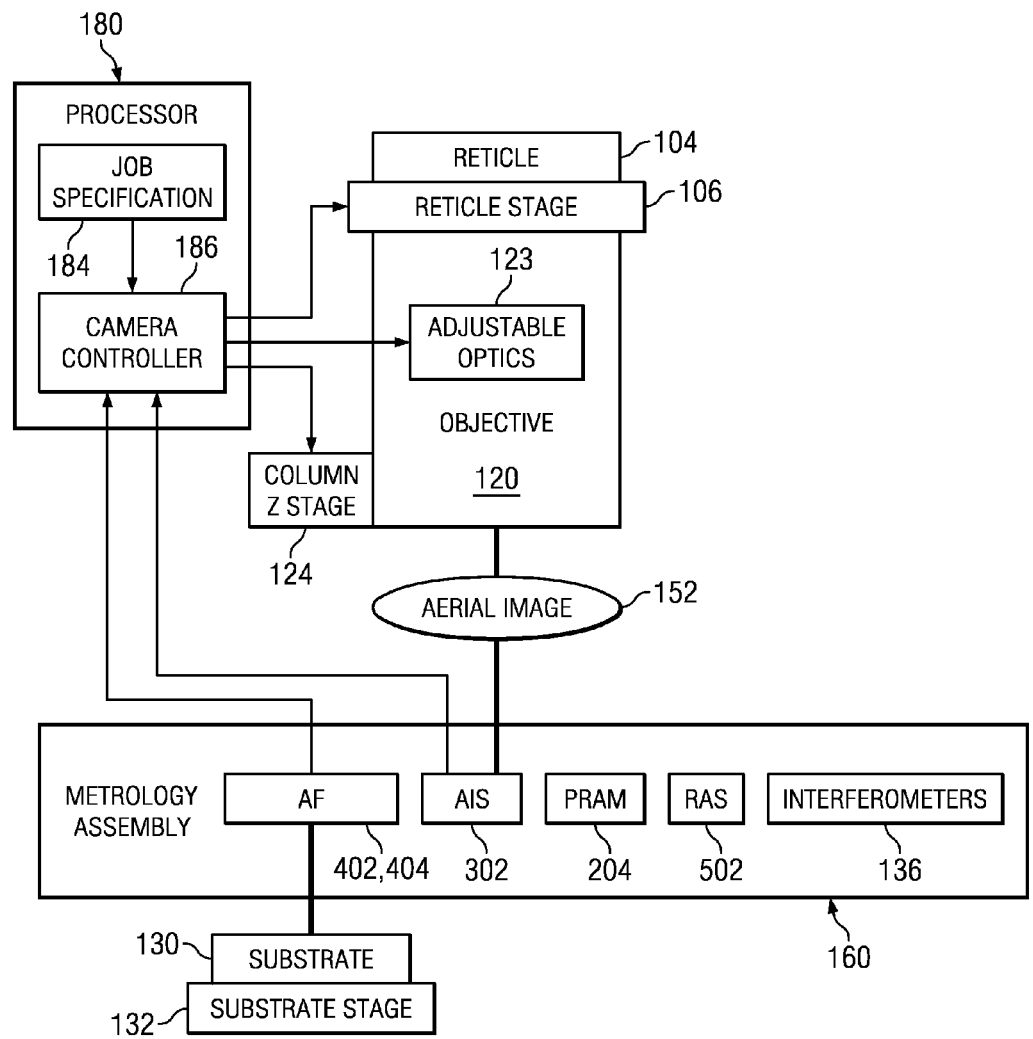
FIGS. 1C and 1D are block diagrams illustrating control configurations for the projection system shown in FIGS. 1A and 1B FIGS. 2A-2D are elevation views of aerial image sensors configured to sense a position of a metrology plate with respect to a position of an image according to embodiments of the present invention.
Figure 1D:
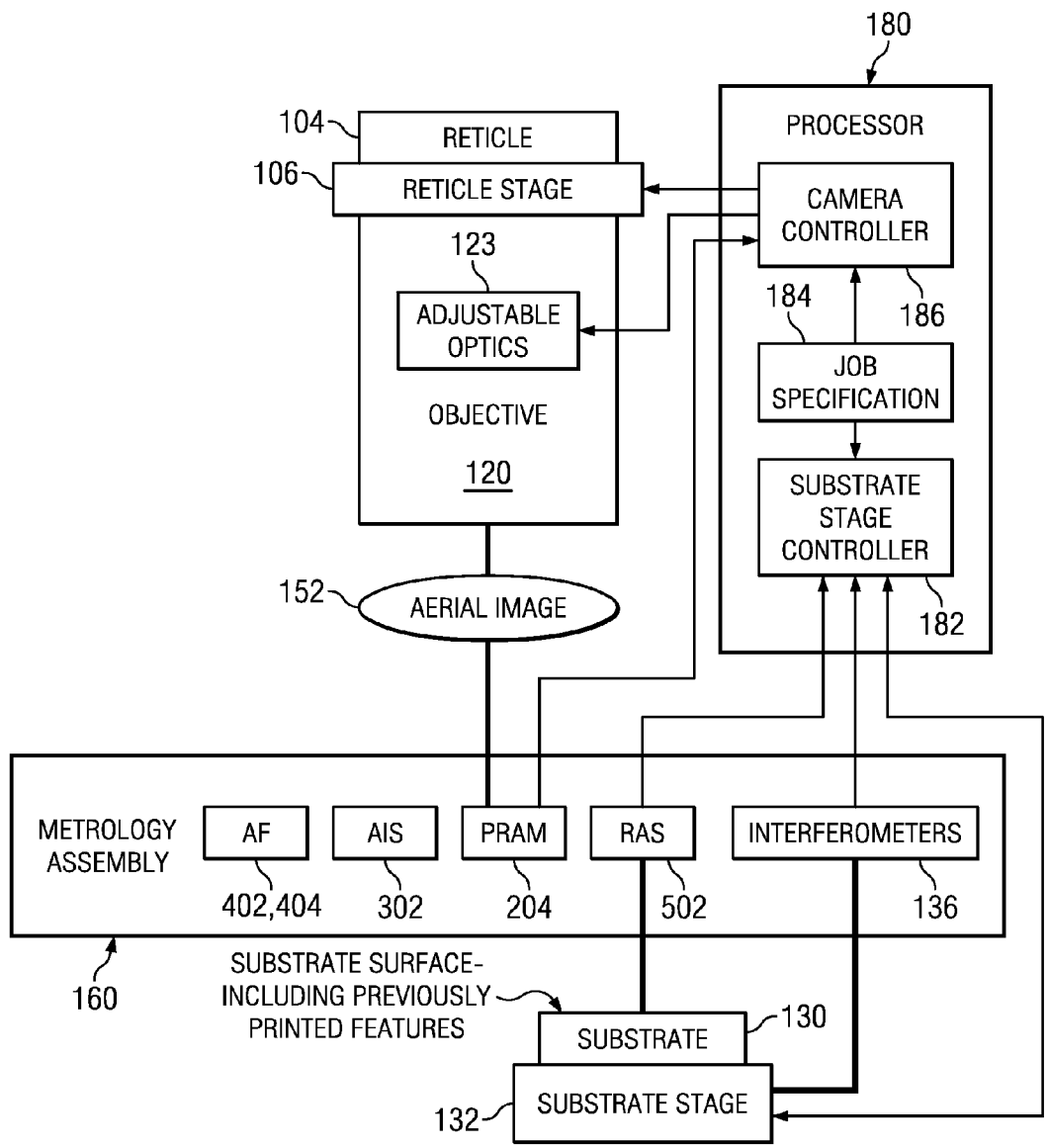

FIGS. 1C and 1D illustrate different arrangements for adjusting the relative positions of the reticle 104, projection optics 120, and substrate 130 using data acquired by sensors (described below) in the system metrology core 160. In each arrangement, the sensors measure the position of the metrology plate 162 with respect to an aerial image 152 and with respect to the substrate 130, as explained in greater detail below. The sensors in the system metrology core 160 transmit the acquired data to a processor 180, which uses the data to estimate the position of the aerial image 152 with respect to the substrate 130.

As shown in FIG. 1C, the processor 180 includes a camera controller 186 that can adjust the projection optics (objective) 120 by actuating a reticle stage 106, adjustable optics 123, and/or a column Z stage 124 based on data from the sensors in the system metrology core 160. Some sensors, such as the PRAM sensor 204, interferometer 136, and RAS 502, are used primarily to determine position error, including rotation error, translation error, and various forms of image distortion. Other sensors, such as the AIS 302, detect attitude error, depth misalignment (defocus) and indications of higher-order aberrations, including astigmatism and field curvature, as explained below.

The processor 180, which may be coupled to any or all of the sensors in the system metrology core 160, uses the collected data to determine alignment conditions that correct for errors due to both misalignment (position error) and aberration. In addition to using the position data acquired by the sensors, the processor 180 may use a job specification 184 to determine how best to align the aerial image 152 to the substrate surface 130. After determining the optimum alignment condition, the camera controller 186 may adjust the transverse position, rotation, height, tip, and/or tilt of the reticle 104 (FIGS. 1A and 1B) relative to the projection optics 120 using the reticle stage 106. The camera controller 186 may also adjust the height of the projection optics 120 relative to the substrate 130 using the column Z stage 124. The camera controller 186 can also compensate for aberration by actuating the adjustable optics 123, e.g., by causing lens elements 122 (FIG. 1A) to move back and forth in the beam path, wedges to move into or out of the beam path, and/or optical elements to rotate, tip, or tilt relative to the beam path.

In the arrangement shown in FIG. 1D, the processor 180 also includes a substrate stage controller 182 that can be used to move the substrate 130 with the stage 132. The substrate stage controller 182 synthesizes data from the RAS 502 and the interferometer 136 with the job specification 184 to determine the optimum position of the substrate 130. Next, the substrate stage controller 182 sends electrical signals to the stage 132 that cause the stage 132 to translate, rotate, tip, and/or tilt the substrate 130, as appropriate.

Alternative mechanically decoupled metrology plates may be disposed elsewhere in the optical train. For example, the metrology plate can be positioned between the reticle and the projection optics and be coupled to one or more sensors that detect reflections of the projected beam from the image, substrate, substrate stage, or another surface on the image side of the projection optics. The metrology plate may also be configured to reflect the projected beam from the projection optics onto the substrate, e.g., by tilting the metrology plate (or a reflecting surface on the metrology plate) with respect to the optical axis of the projection optics and placing the substrate at an image in the path of the reflected beam.

System Metrology Core Construction and Operation

Example system metrology cores (SMCs) combine the precision coordinate systems of many sensors into a single reference frame. Although the SMC may drift or float with respect to the projection optics and the substrate, it is important that each sensor in the various coordinate systems maintains a known relationship to the other sensors and coordinate systems. To meet this requirement, the sensors in the system metrology core should be mounted to or embedded in a stiff, thermally stable structure. Such a structure can be made out of Invar, Corning ultra-low expansion (ULE) glass, Zerodur, or any other material with a sufficiently low coefficient of thermal expansion (CTE).

One example embodiment uses a rigid steel structure, which is mounted to a granite bridge, to support a metrology plate made of material with a low CTE. The metrology plate is kinematically mounted to the steel structure to suspend the SMC in place without over-constraining it. The example metrology frame holds six PRAM sensors and three AIS sensors embedded in an ultra-low expansion frame surrounding the image field. Autofocus sensors, interferometers, and alignment systems are also mounted to the metrology frame.

The PRAM, AIS, and AF sensors sample in a region between the objective (projection optics) and the substrate. The sensors extend into the objective field, but are outside the portion of the field used for printing production patterns. Each sensor is compact enough to fit within the clearance between the projection optics and the substrate stage. Alternatively, stable optical relay assemblies may be used to direct beams to larger sensors mounted elsewhere on the metrology plate.

The laser interferometers are also mounted to the low-CTE metrology frame are (though the laser head may be mounted on another structure). Portions of the metrology plate may extend to the edges of the projection stages so that the mirrors on the stage that reflect the laser beams have clear travel through the stage's entire range. Because of practical considerations, such as the size of available materials, the extended portions of the metrology plate may be separate pieces of low CTE material mechanically coupled to a central metrology plate. Alternatively, the interferometers may be mounted to the bridge or base, with mirrors attached to the system metrology core. The reference beams of the interferometers could be directed to the SMC mirrors or additional interferometer axes may be employed.

Longitudinal Alignment and Aberration Compensation

Figure 2A:
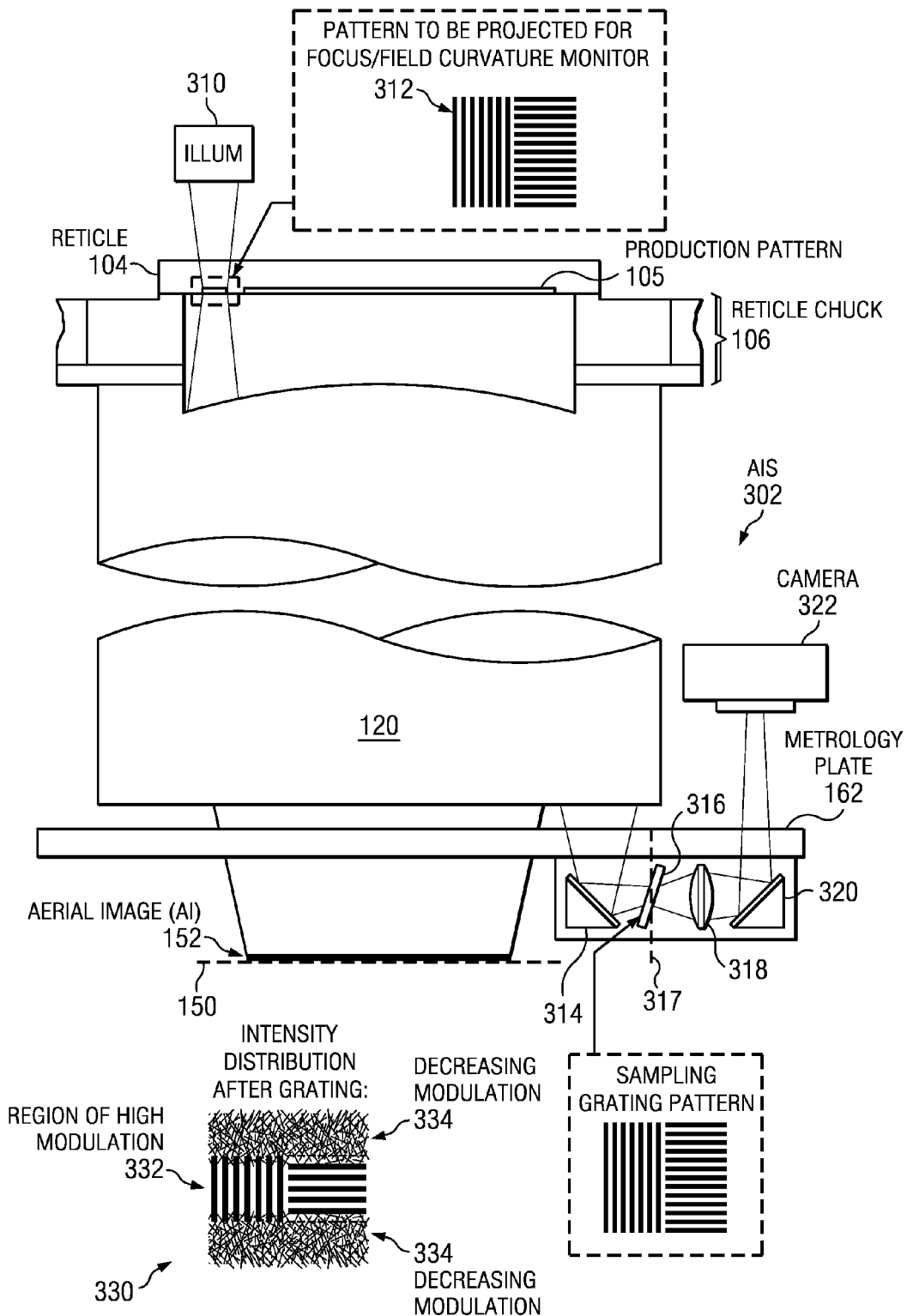

FIGS. 2A-4 illustrate how autofocus sensors 402/404 and aerial image sensors (AISs) 302 are used to find the heights of the substrate 130 and the image 150 of a production pattern 105. FIG. 2A shows an elevation view of a reticle 104 imprinted with both an object grating pattern 312 and production pattern 105. In the example shown in FIG. 2A, the object grating pattern 312 includes two orthogonally oriented sub-gratings used to monitor defocus, astigmatism, and field curvature; other patterns may also be suitable. A light source 310 illuminates the grating 312, and projection optics 120 project an image of the illuminated grating 312 to the image 150. The projection optics 120 also project the aerial image 152 of the production pattern 105 to the plane of the image 150.

A mirror 314 in the AIS 302 redirects the projected image of the grating 312 from the plane of the image 150 to an image grating pattern 316, which is similar to the first grating 312 and tilted about an axis within an equivalent plane 317. (For example, the gratings 312 and 316 may be identical or they may be scaled to account for magnification.) The overlapping grating patterns 312 and 316 form a Moiré pattern 330 that is sensed by a camera 322. As in the Wallace system described above, the peak modulation position of the Moiré pattern 330 depends on the distance of the second grating 316 from the aerial image focus. Similarly, the transverse positions of deeply modulated fringes 332 (and regions of decreased modulation 334) indicate the location of the focal plane with respect to the sampling grating pattern 330. Relay optics 318 and a second mirror 320 image the equivalent plane 317 to a camera 322 whose detector array is an image plane of the Moiré pattern 330.

Figure 2B:
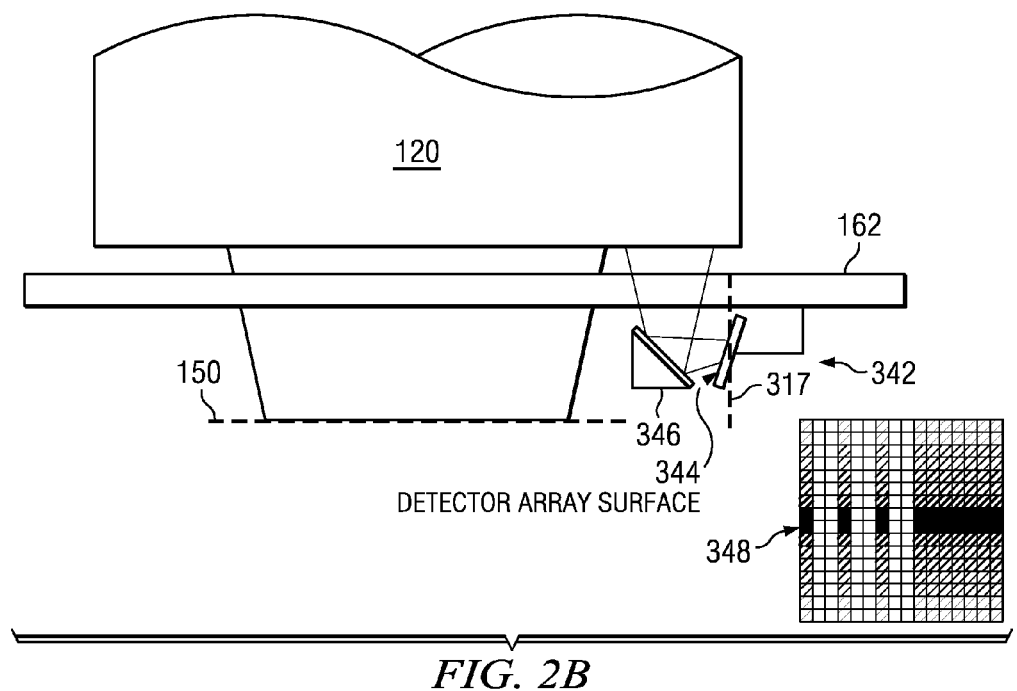

FIG. 2B shows an alternative AIS 342 that uses a mirror 346 to direct light to a pixilated detector array 344 instead of to a second grating 316, relay optics 318, and mirror 320. Because the detector array is periodic in two dimensions, it can be used as a sampling grating, provided that its period (i.e., pixel pitch) is small relative to the pitch of the image grating 312. Like the sampling grating 316 shown in FIG. 2A, the detector array 344 is suspended from the metrology plate 162 and tilted about an axis within a plane 317 equivalent to the plane of the image 150. (Alternatively, the mirror 346 can be tilted as well as or instead of the array 344.) The detector array 344 senses an image 348 corresponding to the object grating 312 sampled at a spatial frequency equal to the pixel pitch, i.e., a Moiré pattern whose fringe modulation depends on the position of the image 150 relative to the metrology plate 162.

Figure 2C:
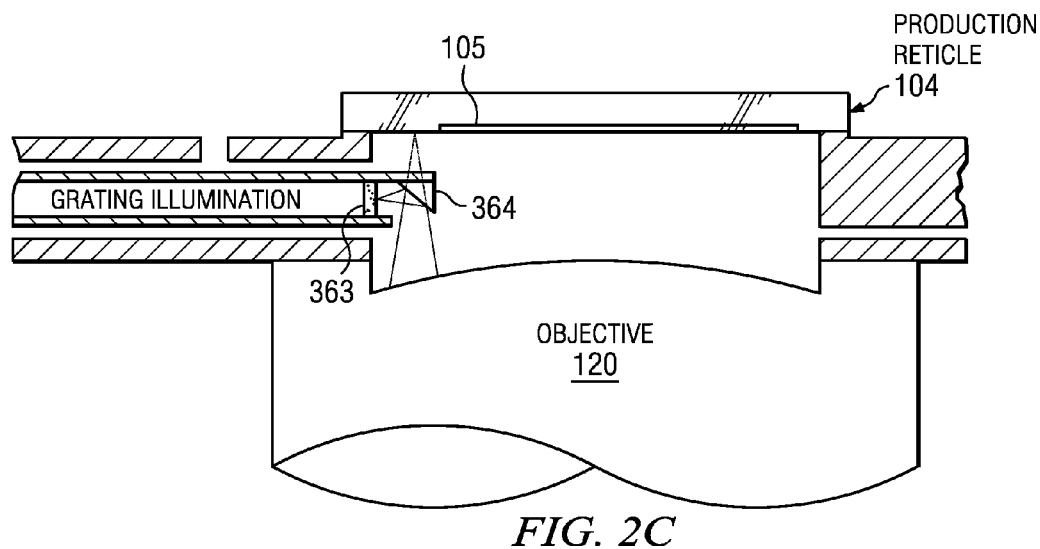
Figure 2D:
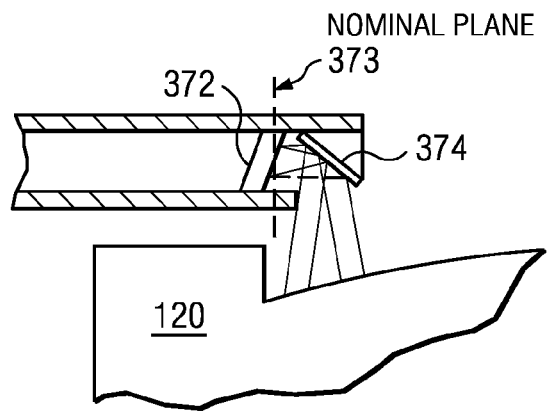
Figure 2D:
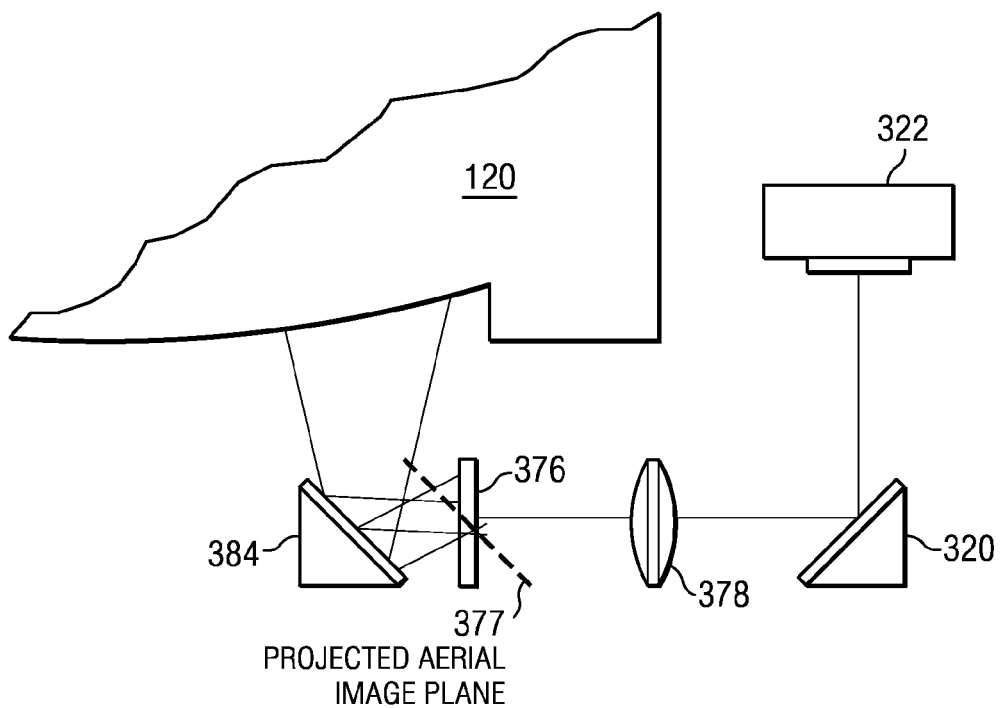

FIGS. 2C and 2D show alternative AIS systems that use separate object gratings 363 and 372, respectively, located in planes substantially equivalent to the plane of the production pattern 105. The separate object gratings 363 and 372 are illuminated, and the transmitted beams are reflected through the projection optics via mirrors 364 and 374, respectively. Because the object gratings 363, 372 and the production pattern 105 are located at substantially equivalent planes, the projection optics 120 images the object gratings 363, 372 to the image plane of the projection optics 120. The object grating 372 is tilted with respect to a plane 373 that is nominally equivalent to the plane of the production pattern, so it is projected to a tilted image plane 377 via a mirror 384. Relay optics 378 image the Moiré pattern that appears when viewing the image of the tilted object grating 372 through an un-tilted grating 376 onto a camera 322.

Figure 3:
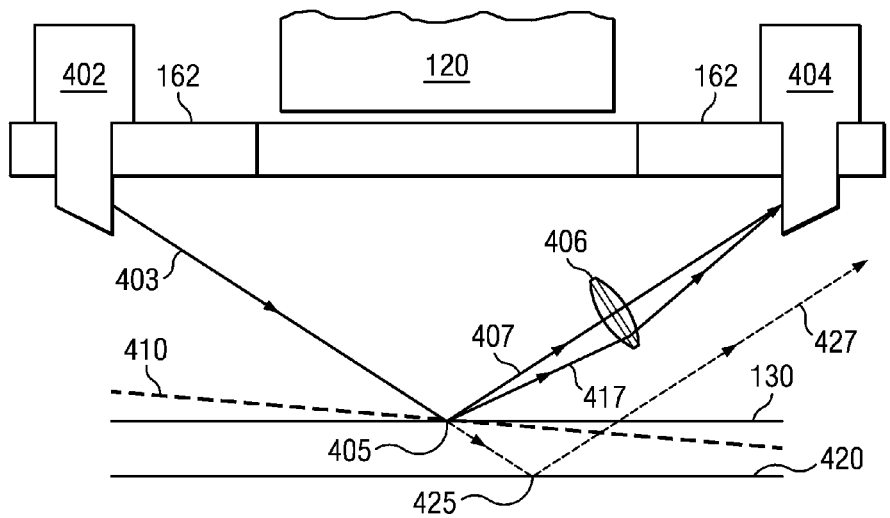
FIG. 3 is an elevation view of an autofocus sensor configured to sense a position of a metrology plate with respect to a position of a substrate according to embodiments of the present invention.

FIG. 3 illustrates how the autofocus transmitter 402 and autofocus receiver 404 are used to estimate the distance between the metrology plate 162 and the substrate 130. The autofocus transmitter 402 emits an autofocus beam 403 that propagates towards the surface of the substrate at a glancing angle. The beam 403 reflects off the substrate 130 at a nominal reflection point 405 to form a reflected beam 407, which is detected by the autofocus receiver 404. If the autofocus transmitter 402 and the substrate 130 move towards or apart from each other, then the reflection point 405 shifts left or right, causing the reflected beam 410 to walk up or down the autofocus detector 404. For example, if the substrate 130 shifts down to a new position 420, then the beam 403 reflects off a point 425 to form a reflected beam 427 that misses the receiver 404.

Changes in angular alignment may also cause the reflected beam 403 to shift with respect to the receiver 404, making it difficult to tell whether the substrate 130 has shifted or tilted with respect to the metrology plate 162. Using a lens 406 to image the nominal reflection point 405 onto the receiver 404 eliminates measurement ambiguity due to tilt about the nominal reflection point 405. If the substrate 130 tilts about the nominal reflection point 405 to a new position 410, it reflects a deviated beam 417 that deviates from the nominal path to the receiver 404. As long as the deviated beam 417 falls within the numerical aperture of the lens 406, the lens 406 images the deviated beam 417 onto the receiver 404 in substantially the same location as the un-deviated beam. Multiple autofocus sensors or an autofocus sensor coupled with a substrate tilt sensor can be used to resolve compound motion (e.g., shift and tilt about the nominal reflection 405, which can also be described as tilt about a point other than the nominal reflection point).

Figure 4:
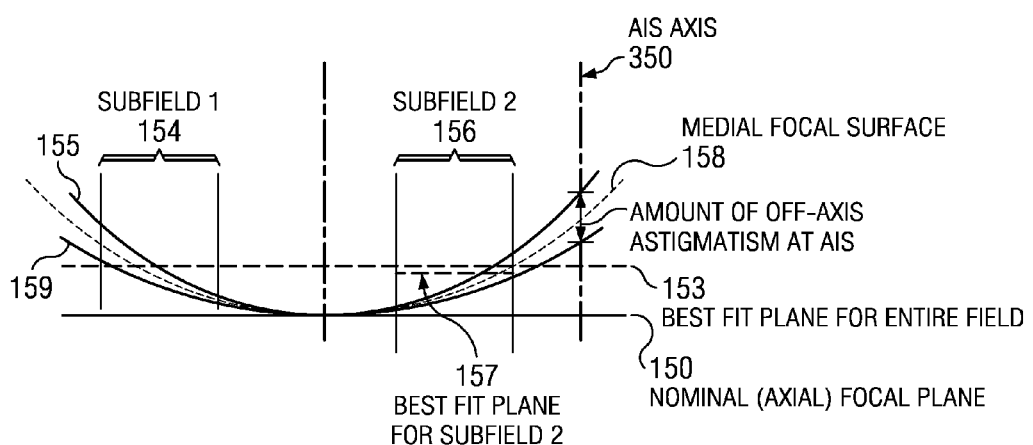
FIG. 4 is an elevation view illustrating the shape of an aerial image surface.

FIG. 4 illustrates how the actual shape of the image 150 can deviate from planar due to aberrations, particularly those induced by lens heating, drift, and other perturbations. As described above, an AIS (not shown) monitors the height of the image 150 with respect to the metrology plate 162. In some cases, astigmatism may cause the sagittal and tangential rays to come into focus at different planes; in most positive lenses, the tangential focus is ahead of the sagittal focus. Astigmatic, positive lenses usually produce two perpendicular "line" images at different depths, with a circular blur—the "circle of least confusion"—at a depth between the line images. Astigmatism may restrict the finest resolution to the diameter of the circle of least confusion.

Astigmatism is usually correlated with Petzval field curvature, a condition in which the actual image surface curves away from the surface of the nominal image 150. In FIG. 4, there are two image surfaces 155 and 159, one each for the sagittal and tangential rays, that have different radii of curvature. The difference in radii of curvature causes the separation between the in-focus surfaces 155 and 159 to increase with radius, which causes different subfields within the image to have different "best-fit planes," or planes parallel to the image for which the aggregate focus error across the subfield is at a minimum. For example, subfields 154 and 156 have different best-fit planes because they are located at different distances from the center of the image 150. Measurements of the sagittal and tangential focus locations may be used to estimate both a medial focal surface 158 and a best-fit plane 153 for the entire field. Fortunately, field curvature and astigmatism may be calibrated and estimated before exposure, then estimated during exposure, as described below. For more information on astigmatism, field curvature, and other aberrations, see, e.g., D. C. O'Shea, "Elements of Modern Optical Design," Wiley-Interscience (New York 1985), incorporated herein by reference in its entirety.

Figure 5:
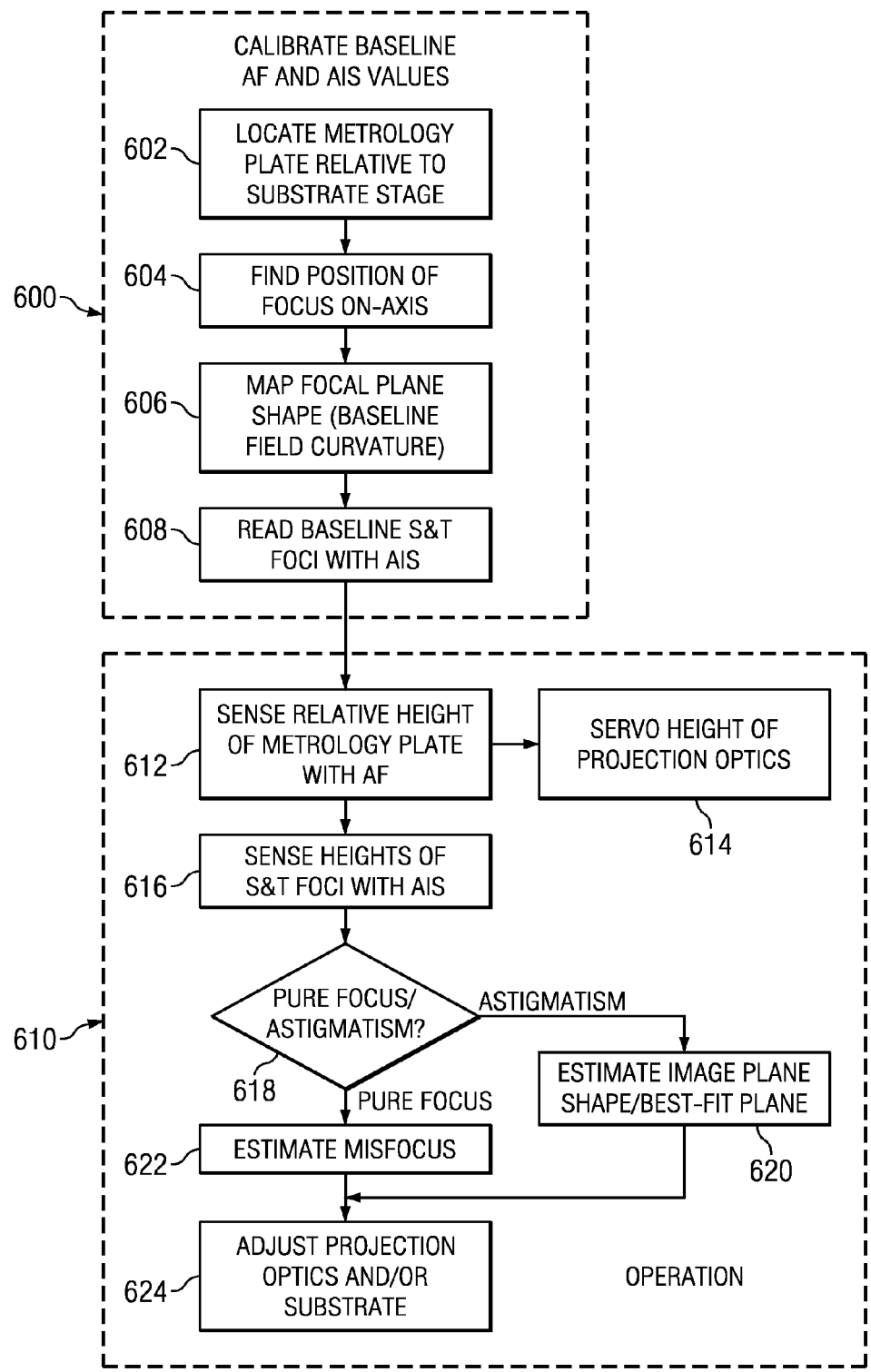
FIG. 5 is a flow diagram that illustrates determination and correction of changes in pure focus, astigmatism, and field curvature using an aerial image sensor.

FIG. 5 is a flow diagram that illustrates how an AIS can be used as a field curvature sensor. First, the autofocus (AF) sensor is calibrated (600) by using the AF sensor to determine the position of the metrology plate relative to a metrology sensor package on the substrate stage (602). Next, an on-axis modulation transfer function (MTF) sensor that is part of the metrology sensor package determines the position of the aerial image focus (604). Moving the MTF sensor throughout the field maps the focal plane shape (baseline field curvature) relative to field center focus (606), and reading the AIS yields baseline positions of the sagittal and tangential (S & T) foci at the AIS field location (608).

Once the autofocus sensor and the AIS are calibrated, they can be used during operation (610) of the photolithography system. In operation, the autofocus sensor is used to sense the difference in the height (relative to the metrology plate) of whatever is under the autofocus sensor in comparison to the calibrated location of the metrology sensor package on the substrate stage (612). Nominally, the system servos the height of the projection optics to bring the difference back to zero (614). In practice, the projection optics may be driven to a modified position based on input from other sensors.

The output of the AIS is read repeatedly in real-time or at appropriate time intervals to sense changes detected in the sagittal and tangential foci relative to their calibrated positions (616). Pure focus changes (i.e., changes in the focus throughout the field) of the image relative to the metrology plate cause the sagittal and tangential foci to move by the same amount in the same direction. Once it is determined whether the AIS has sensed a pure focus change (618), information gathered by the AIS can be used to estimate (622) and adjust (624) the height of the substrate relative to the projection optics or vice versa.

Changes in astigmatism correlate in a known way to changes in field curvature, which causes the sagittal and tangential foci to move by amounts that differ in sign, magnitude, or both. Since the difference in movement of the sagittal and tangential foci is a measure of astigmatism and since the astigmatism is correlated to field curvature, information relating to the movement of the sagittal and tangential foci can be used to estimate (620) shape of the image. (With one AIS sensor, an assumption of rotational symmetry is used.) Combining knowledge of the shape of the image with system knowledge of what region of the field is being used for exposure enables determination of a best-fit plane (620). If the substrate shape is known (e.g., via a mapping sensor or a prior topography measurement), then information about the substrate shape can be included in the best-fit plane determination (620). The best-fit plane can be used by the system to set a new target to which autofocus servos the projection optics (624).

Transverse Alignment and Systems with Multiple Projection Optics

Figure 6:
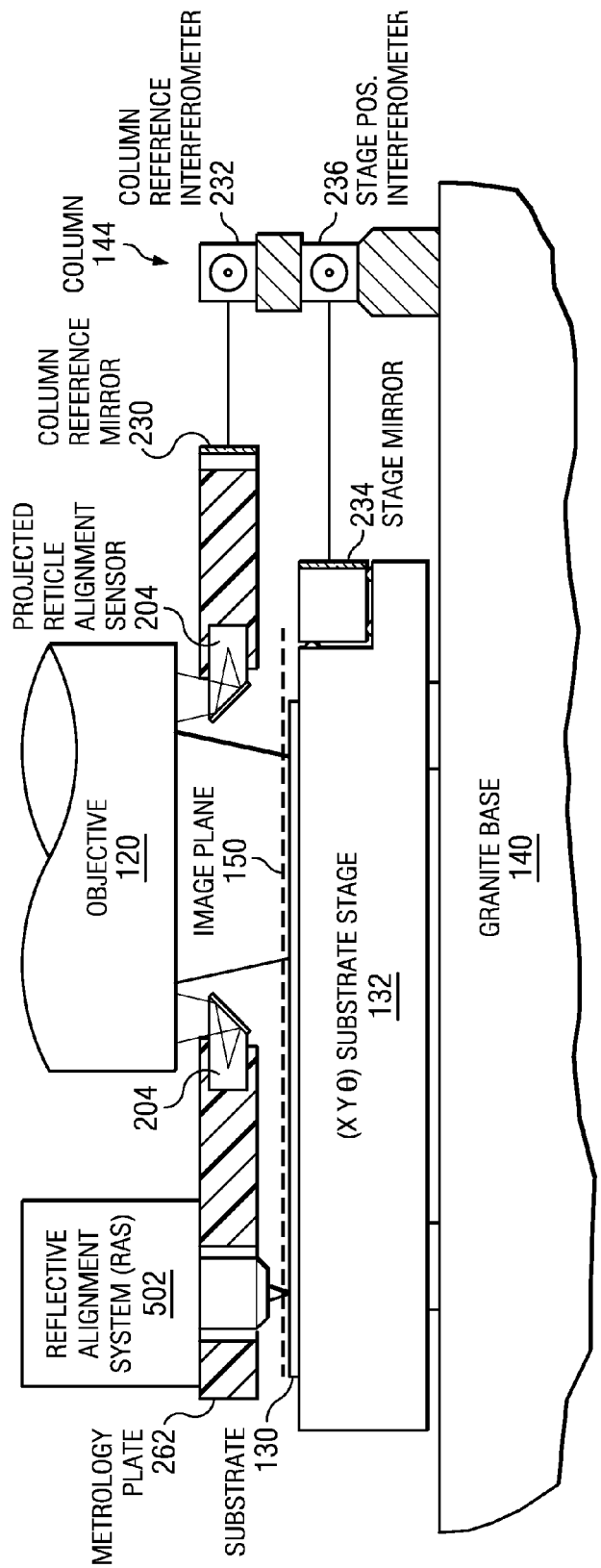
FIG. 6 is an elevation view of an example system metrology core (SMC), objective, and substrate according to embodiments of the present invention.

FIG. 6 is a schematic diagram that shows how a mechanically decoupled metrology plate 262 is used to align an image 150 to a substrate 130 in greater detail. A RAS 502 on the metrology plate 262 measures the transverse position of the metrology plate 262 relative to the surface of the substrate 130 by imaging a fiducial mark on the substrate 130. Alignment procedures executed by the RAS 502 or by the controller 180 determine the image location in the RAS's coordinate system, which is usually calibrated relative to the rest of the system metrology core before exposure. If the metrology plate 262 is aligned correctly, a detector array (not shown) in the RAS 502 detects an image of the fiducial mark that is correctly aligned and in focus. Deviations from the correct alignment cause the image of the fiducial mark to shift, rotate, and/or blur, depending on the nature of the alignment.

Although the RAS 502 is used primarily for transverse alignment, error in height may cause the image of the fiducial mark to appear out of focus, blurring the image by an amount proportional to the absolute height error. Ambiguity in the height error can be resolved by moving the RAS 502 up or down relative to the fiducial mark to see if the blur increases or decreases. It can also be resolved with data collected by other sensors, including the autofocus sensors 402 and 404 (FIG. 1A), or an equivalent sensor dedicated to maintaining focus of the RAS 502.

PRAM sensors 204, also called projected image alignment sensors 204, sense images of a PRAM 202 (FIG. 1A) on the reticle 104 (FIG. 1A). Because the PRAM 202 and the production pattern 105 (FIG. 1A) are both on the reticle 104, the projection optics 120 image the PRAM 202 and the production pattern 105 (FIG. 1A) to the same plane as the image 150. As a result, detecting the image of the PRAM 202 provides information about the transverse displacement and rotational alignment of the image 150 relative to the metrology plate 262, as described in greater detail below.

FIG. 6 also shows interferometers 232 and 236 used to measure the transverse positions of the metrology plate 262 and stage 132, respectively, relative to a granite base 140. (The interferometer 136 shown in FIGS. 1A and 1B can be used to make the same measurement.) The interferometers 232 and 236, which are mounted on an interferometer stack 144 projecting from the base 140, emit laser beams towards mirrors 230 and 234, respectively, mounted on the metrology plate 262 and the stage 132, respectively. The mirrors 230 and 234 reflect the beams, and the interferometers 232 and 236 detect the reflected beams, producing interference signals indicative of the distances between the mirrors 230 and 234 and the interferometer stack 144. Changes in these distances cause corresponding changes in the interference signals that can be used to establish the transverse position of the metrology plate 262 relative to the substrate stage 132.

Figure 7A:
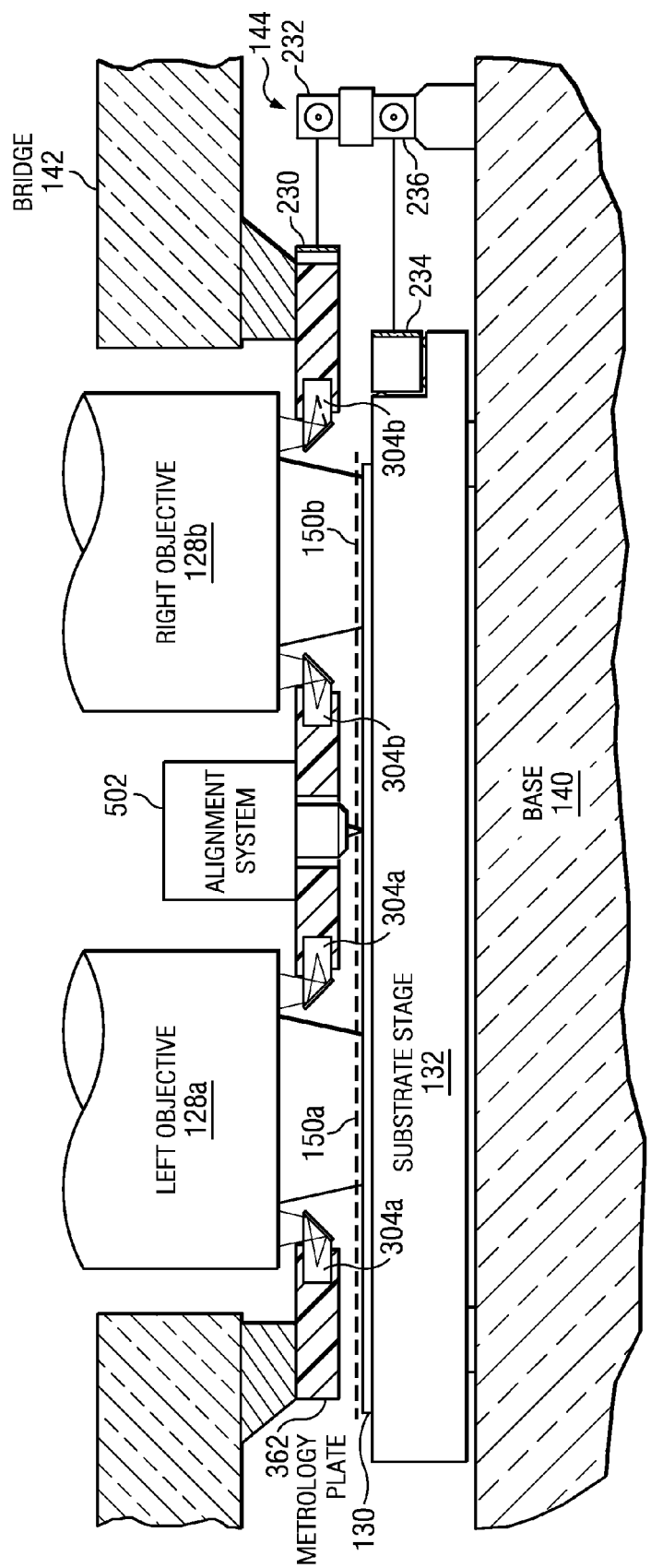
FIG. 7A is an elevation view of an alternative SMC, dual objectives, and substrate according to embodiments of the present invention.

FIG. 7A shows an alternative decoupled metrology plate 362 that can be used with left and right objectives 128a and 128b to image two patterns onto a single substrate 130 and/or to image patterns onto two substrates at once. Because the metrology plate 362 is not coupled to either objective 128a or 128b, the objectives 128a and 128b can be adjusted independently. For example, they can each be adjusted in position, attitude, and magnification to compensate for different errors and rates of drift, or to accommodate different production images and settings. As in FIG. 6, a RAS 502 estimates the alignment of the metrology plate 362 with respect to the substrate 130, and interferometers 232 and 236 monitor the transverse distance between the metrology plate 362 and to the substrate 130. In addition, each objective 128a, 128b has its own set of PRAM sensors 304a, 304b, each of which measures the location of a respective image plane 150a, 150b with respect to the metrology plate 362.

As will be understood by those skilled in the art, alternative decoupled metrology plates may accommodate more than two objectives. Alternatively, the metrology plate can be broken into multiple metrology sub-plates, each of which is associated with a particular objective or set of objectives. Metrology sub-plates also allow for independent adjustment of the objectives, provided that the metrology sub-plates are decoupled from the objectives or decoupled from each other or both and their positions can be established relative to the image(s) and substrate(s).

Setup and Calibration of Systems with Multiple Projection Optics

Figure 7B:
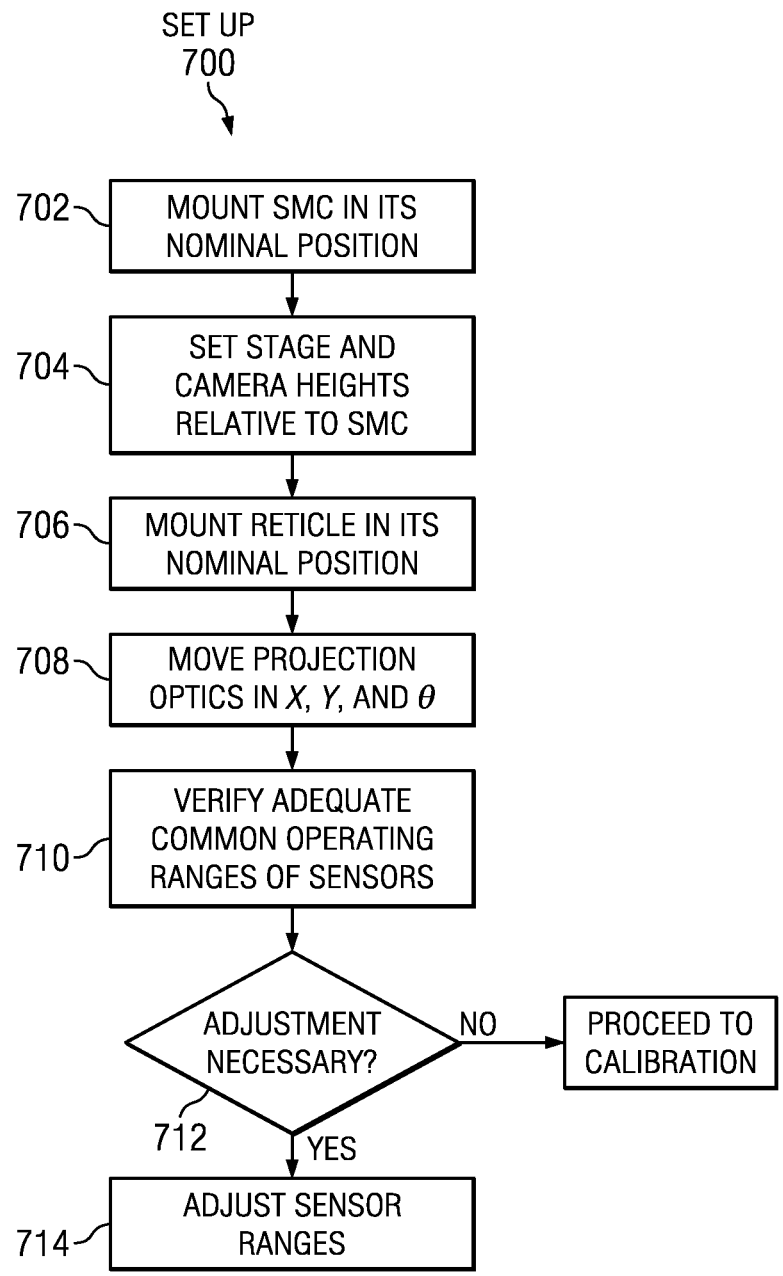
FIGS. 7B and 7C are flow diagrams that illustrate set up and calibration of an SMC with two objectives according to embodiments of the present invention.
Figure 7C:
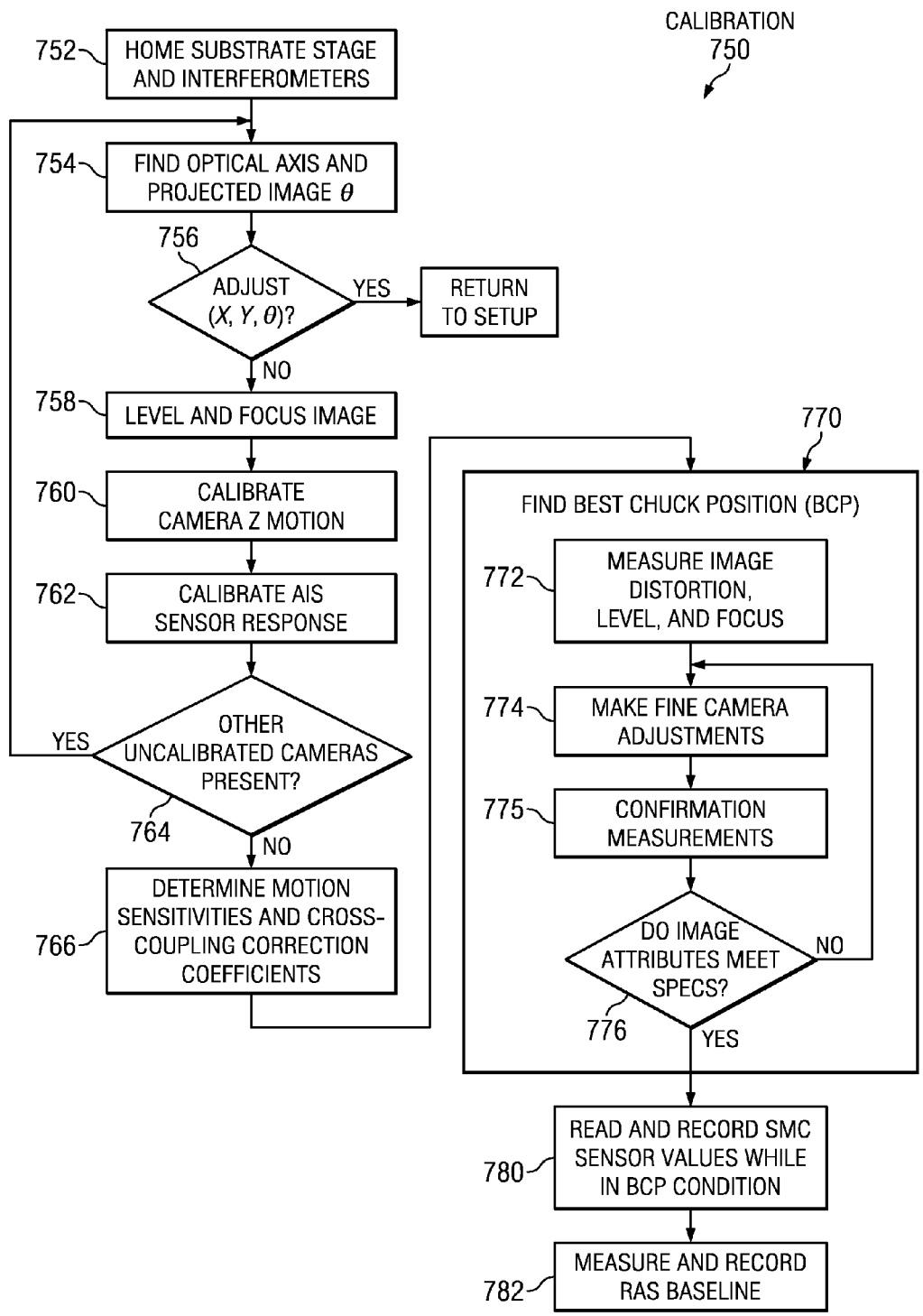

FIGS. 7B and 7C are flow diagrams that illustrate set up and calibration, respectively, for a system with two sets of projection optics (also called cameras or objectives). Set up 700, shown in FIG. 7B, begins by mounting (702) the system metrology core (SMC) in its nominal position under the system bridge. This pre-supposes that the SMC sensors have been previously mounted to the SMC and aligned such that all sensor ranges overlap by at least the expected operating range. This condition is established either by design or by use of fixturing. Next, the stage and projection optics heights are set (704) relative to the SMC using conjugate location information provided by the lens manufacturer.

Once the relative heights are set, a reticle with the PRAMs or other fiducial marks is mounted (706) to the reticle chuck, which is placed in its nominal position in all six axes (x, y, z, θ, tip, and tilt) based on values provided by the lens manufacturer. The projection optics and reticle stage are then moved (708) in x, y, and θ to bring the projected images to the mid-capture ranges of the PRAM sensors. Next, the sensors' operating ranges are verified (710) to ensure proper operation; if necessary (712), the sensors and/or sensor positions are adjusted to ensure proper overlap of the sensors' ranges (714).

FIG. 7C illustrates an iterative calibration process 750 that can begin as soon as the reticle stage, projection optics, and SMC are mounted (752) in their nominal positions. Before iterative calibration 750 begins, a metrology sensor package (MSP) is mounted in the substrate stage and can be positioned using the substrate stage's interferometer control to sample any field location. The MSP includes several specialized sensors—two of which are used for these calibrations: a Transmissive Alignment Sensor (TAS) measures lateral image position errors of projected fiducial marks; a Modulation Transfer Function (MTF) sensor is used to map modulation of a projected grating as a function of camera Z position. The modulation vs. camera Z information is used to determine "best focus" at the field location being sampled. The MSP sensors are substantially coplanar and the calibrations are performed in the plane defined by the motion of the MSP.

The TAS measures lateral image displacement like the PRAMs do, but resides in the MSP on the substrate stage instead of being part of the SMC. Similarly, the AIS and the MTF sensor measure displacement along the optical axis (i.e., in z), albeit using different measurement techniques, but the AIS is fixed in space on the SMC, whereas the MTF resides in the MSP on the substrate stage. The TAS and the MTF sensor can also be driven to various points in the image plane by moving the substrate stage. The TAS and the MTF sensor are typically used for intermittent (calibration) measurements, whereas the SMC sensors (i.e., the AIS and the PRAM sensors) are used to continuously monitor the field periphery. More details of the TAS can be found in U.S. Pat. No. 4,769,680 to Resor et al., incorporated herein by reference in its entirety.

A calibration reticle containing the appropriate TAS fiducial marks and MTF gratings is placed at the nominal object plane of the projection lens (established during set up). This reticle also contains PRAM and AIS features that are appropriately located to correspond to the PRAM and AIS sensors in the image region.

Initially, the TAS measurements are used to find the projected calibration fiducial images accurately enough in x, y, and θ (754) to position the MSP sensors so the projected fiducial images are within the measurement ranges of the MSP sensors. The collected TAS measurements are used to determine (756) whether or not the sensor and stage positions should be adjusted; if necessary, setup 700 (FIG. 7B) can be repeated as necessary until the sensors and stages are aligned correctly. Once the projected fiducial images are verified to be within the measurement ranges of the MSP sensors, the image plane is focused and leveled (758) so subsequent TAS measurements are collected while in focus.

The image plane position is determined by finding "Best Focus" at several field locations (758). Best focus is determined by scanning the MTF sensor slit across the projected grating at several camera Z (focus) positions. The Z position range spans the aerial focus position. The camera Z position (as measured by a position sensor in the Z actuator, for instance) corresponding to maximum modulation is recorded as the "Best Focus" position for that field location. A plane is fit to the data and represents the measured Z, tip, and tilt of the aerial image. The reticle is tipped and tilted to level the image. The camera is adjusted in Z. Measurement and adjustment are iterated as necessary until the measurement confirms the projected image is level and focused in relation to the MSP sensing plane. With the MSP located at the AF sensing location, the AF signal and AIS signals are recorded. These signal values are subsequently used as reference values when monitoring image focus and levelness changes (whether commanded or due to system drift).

To operate accurately in a condition where the AF and AIS sensors are not at the nominal values determined above, the sensor response should be calibrated throughout the expected range of operation. The camera Z motion and AIS sensor responses can be calibrated (762) by measuring the camera Z motion with a precision displacement sensor (760) (e.g., a linear variable differential transducer (LVDT), cap sensor, or the like) and recording the corresponding AF and AIS sensor signals for each Z position. Each sensor may have its own unique calibrated relationship. Three LVDTs, to measure camera Z plus tip and tilt, may be necessary if the camera Z motion exhibits excessive tip/tilt errors. If additional uncalibrated projection optics are present (764), the process for setup and calibration is repeated for each set of projection optics and its associated SMC sensors.

Before proceeding with in-plane calibrations, the cross coupling and sensitivities of all camera control degrees of freedom are established (766). These include the six degrees of freedom in the reticle chuck, camera Z, and the three degrees of freedom in the adjustable optical element. This is done by moving each motion axis to several positions throughout its range of operation and recording the effects on the image map using the TAS sensor. Sensitivities and cross coupling coefficients for all motions can be determined by analyzing the entire resulting dataset. This results in a 10×10 correction coefficient matrix if all the degrees of freedom listed above are accounted for. The associated responses from each PRAM sensor are recorded as well throughout each step in this calibration and their sensitivities are similarly established.

The number and locations of the PRAM sensors should be appropriate for the number and form of errors to be monitored. For instance, if all the PRAM sensors are located on the same field radius, it may not be possible to discern a magnification change from a distortion change. Different field radii should be sampled to satisfy this case without ambiguity.

Once the above calibrations have been performed, a single-axis motion can be commanded and the indicated small corrections to the other axes (that are not nominally required to move) are applied. A substantially more accurate, "purer" motion results.

Calibration continues with the determination of an optimum position (770), also known as the best chuck position (BCP). First, a sufficiently detailed map of the image is made using the TAS sensor (772). What constitutes "sufficient" depends on the errors expected to be present in the image. The number and locations of the sample points are chosen to adequately sense and differentiate these expected error components. Camera adjustments (774) and confirmation measurements (775) are iterated until in-plane position errors have been adequately minimized. With the system in this optimized state, the PRAM sensor signals are recorded (780).

These values are used in the control loop for image position (and magnification and distortion) control during subsequent system operation.

The process of measuring and adjusting the image position also determines where the projection optics center line is located in the substrate stage coordinate system. After this has been done for all projection optics on the system, the MSP is moved to the nominal location of the RAS unit (or units). The RAS unit measures the location of a RAS alignment mark that is accurately located on the MSP. In this manner the distance from the center line of each projected production image to each RAS unit center line is established (782).

During daily operation only a sub-set of these calibration tests may be needed. Typically the projected image is checked with the MSP for several X, Y locations, and a quick check of best focus is done on-axis. Small adjustments in the camera are then made to tune up these relationships, and then the SMC sensor reference values are reset. The relationship between the optical center line of the projected images and the RAS units are measured and the calibration data base is updated.

Projected Reticle Alignment Marks (PRAMs)

Figure 8A:
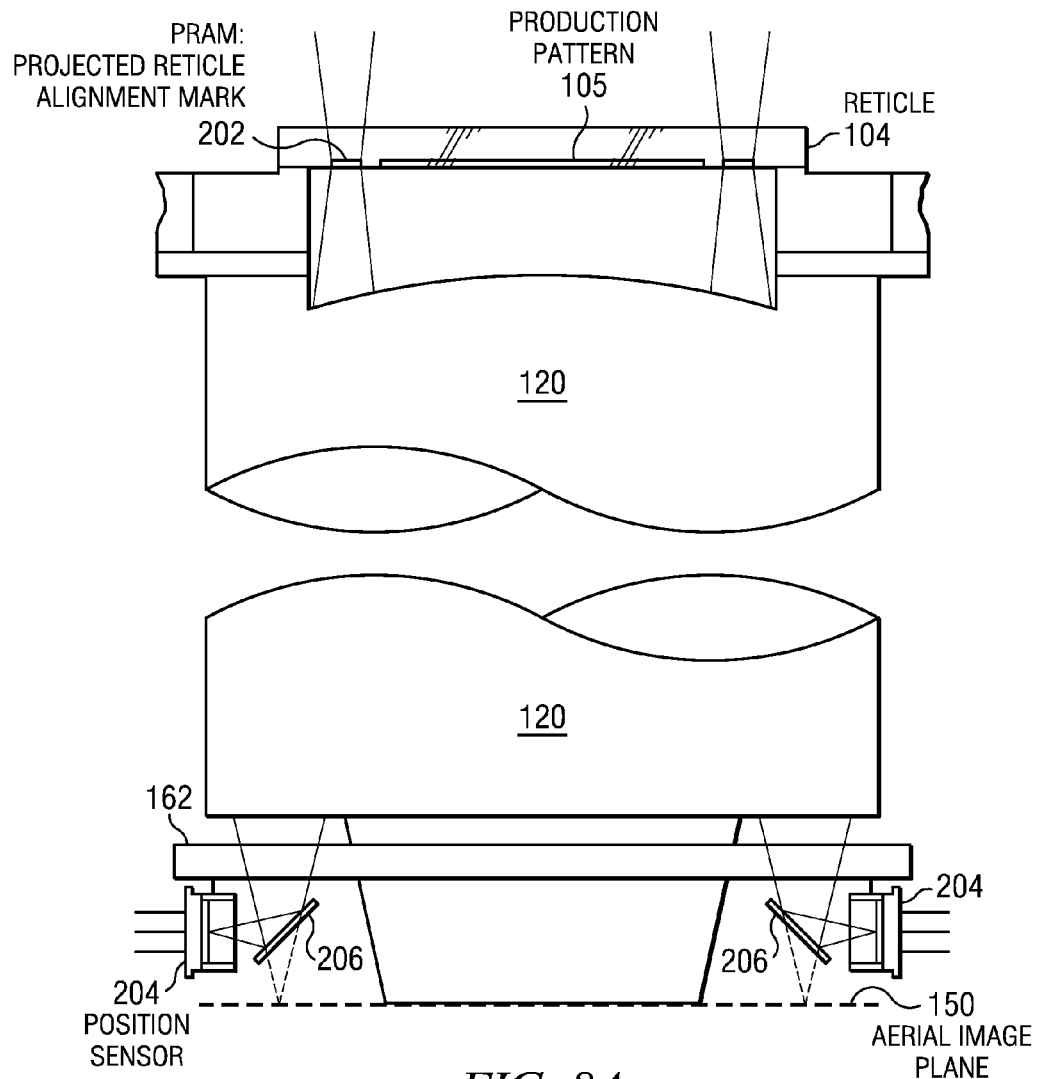
FIGS. 8A and 8B are elevation views of projected reticle alignment marks (PRAMs) used to align an SMC to projection optics according to embodiments of the present invention.

FIG. 8A is an elevation view of PRAMs 202 and PRAM sensors 204 that can be used to align the reticle 104 with the metrology plate 162. Beams illuminate the PRAMs 202, which are typically at or near the edge of reticle 104. Because the PRAMs 202 are in the same plane as the production pattern 105 on the reticle 104, the projection optics 120 image the PRAMs 202 and the production pattern 105 to the plane of the image 150. Mirrors 206 typically near the edge of the field of view of the projection optics 120 direct the transmitted PRAM beams to position sensors 204 that are in planes substantially equivalent to the surface of the substrate 130. That is, the sensors 204 and the substrate surface are similar optical distances from the bottom of the projection optics 120.

As the projection optics 120 heat up or cool down, for instance, the image 150 moves and warps, producing changes detected by the position sensors 204, which may be quadrant detectors, hub-and-spoke detectors, position-sensitive detectors, or any other suitable detector. A processor 180 (FIGS. 1B-1D) operably coupled to sensors 204 actuates chucks and other elements in response to signals from the sensors 204. For example, if the sensors 204 detect a signal indicative of a translation change, the controller determines the degree of error and actuates the reticle chuck 106 or substrate stage 132 to adjust the position of the image 150 relative to the substrate 130. The processor 180 also compensates for theta errors and other potentially higher-order errors, such as magnification, distortion, and trapezoid, by actuating relative movement of the reticle 104, projection optics 120, and the substrate 130.

Figure 8B:
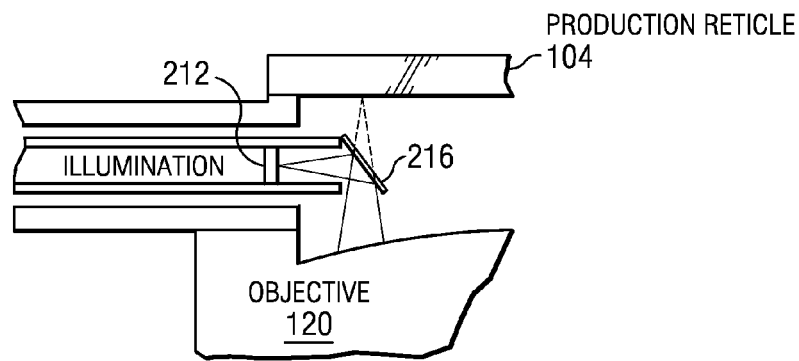

FIG. 8B shows an alternative PRAM 212 that is on a separate reticle located in a plane substantially equivalent to the plane of a production pattern 105 rather than on the reticle 104 itself. A beam illuminates the alternative PRAM 212, and a mirror 216 directs the transmitted beam through the projection optics 120. Because the alternative PRAM 212 and the production pattern 105 are a similar optical distance from the projection optics 120, the projection optics 120 image the alternative PRAM 212 and the production pattern 105 to approximately the same plane as the image 150. A mirror directs the transmitted PRAM beam to a position sensor 204, as described with reference to FIGS. 6 and 7.

Figure 9:
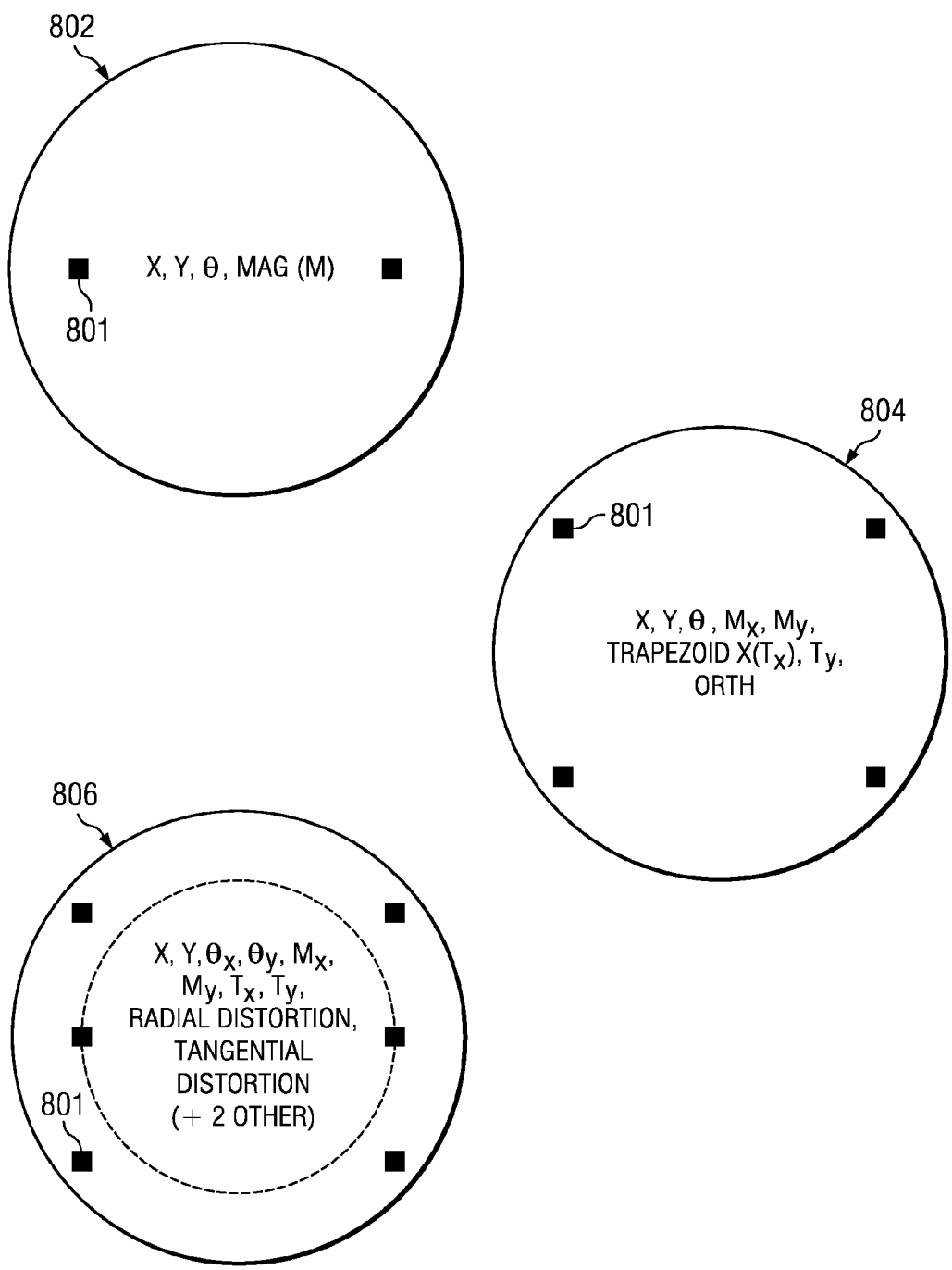
FIG. 9 shows plan views of PRAM configurations for sensing different types of errors, including translational misalignment, rotational misalignment, zoom errors, and distortion.

FIG. 9 shows plan views of different arrangements 802, 804, and 806 of PRAM image locations 801 in the objective's field of view. The first arrangement 802 includes two PRAM images 801 on diametrically opposed sides of a circle near the perimeter of the field of view. Two PRAM images can be used to detect field-uniform errors: transverse displacement (x and y), transverse rotation ($\theta_z$), and magnification (M). The second arrangement 804 includes four PRAM images 801 distributed at the corners of a rectangle at the perimeter of the field of view. The second arrangement can be used to detect transverse displacement (x and y), transverse rotation ($\theta_z$), transverse magnification ($M_x$ and $M_y$), trapezoidal distortion ($T_x$ and $T_y$), and orthogonality error, i.e., when the X axis is not exactly perpendicular to the Y axis. The third arrangement 806 extends the PRAM feedback system to higher order: four PRAM images 801 are distributed at the corners of a rectangle at the perimeter of the field of view, and another pair of PRAM images 801 are at intermediate positions of differing field radius. The third arrangement 806 can be used to detect transverse displacement (x and y), transverse rotation ($\theta_z$), transverse magnification ($M_x$ and $M_y$), trapezoidal distortion ($T_x$ and $T_y$), orthogonality, radial distortion, and tangential distortion (in x).

In general, the PRAM images 801 may be distributed in almost any fashion, provided that their locations are known and that they do not interfere with projection of the production pattern 105. Likewise, the number of PRAM images 801 depends on the desired precision and type of error detection, where the number of error components is equal to up to the number of PRAM images 801 times the number of degrees of detection per image 801. For instance, if each PRAM sensor 204 can sense error in both x and y, and there are six PRAM images 801, then the PRAM sensors 204 can be used to detect up to twelve different types of error, depending on the arrangement in the field.

Alternative Object Formation Techniques

Scanning optical systems and spatial light modulators can also be used instead of reticles to form the objects imaged by the projection systems described herein. For example, a laser beam can be scanned across the object plane with a digital mirror device, galvo-scanning mirror, or acousto-optic device to produce an imaging beam that scans the across the image plane to form the image. Alternatively, the reticle can be replaced with a spatial light modulator (SLM) that modulates the amplitude and/or phase of the illuminating beam. Certain light sources, such as arrays of light-emitting diodes (LEDs) and arrays of vertical-cavity surface-emitting lasers (VCSELs), can be modulated directly to form spatially varying beams in the object plane. Modulated beams from SLMs, LED arrays, and VCSEL arrays may also be magnified to form patterns at the object plane of the projection optics that are suitable for imaging to the substrate. These scanning beams and modulated light sources can be aligned to the projection optics and/or the substrate with the decoupled PRAMs and fiducial marks described above.

Hardware and Software for Image Projection

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

While this invention has been particularly shown and described with references to example embodiments thereof, it will be understood by those skilled in the art that various changes in form and details may be made therein without departing from the scope of the invention encompassed by the appended claims. For example, the metrology plate, field curvature measurement, and sensors described above may be used with optical sources, ultraviolet sources, X-ray sources, even electron-beam sources, and ion-beam sources.

What is claimed is:

1. A method for estimating a field curvature of a projected image projected by projection optics, the method comprising the steps of:
    detecting sagittal and tangential foci of at least a portion of an aerial image corresponding to the projected image, wherein the aerial image is disposed between the projection optics and a reference surface selected from the group consisting of a surface of a substrate and a surface of a coating on the substrate;
    estimating a field curvature of the aerial image based at least in part on the sagittal and tangential foci; and
    estimating the field curvature of the projected image based at least in part on the estimated field curvature of the aerial image.

2. The method of claim 1, further comprising the step of:
    determining a best fit image plane based at least in part on the sagittal and tangential foci.

3. The method of claim 2, further comprising the step of:
    adjusting a position of the best fit image plane with respect to the reference surface.

4. The method of claim 3, wherein the step of adjusting a position of the best fit image plane with respect to the reference surface comprises the step of moving at least one of the best fit image plane or the substrate.

5. The method of claim 1, wherein:
    the reference surface is the surface of the coating on the substrate; and
    the step of detecting sagittal and tangential foci occurs during exposure of the surface of the coating on the substrate in a photolithographic process.

6. An apparatus comprising:
    an aerial image sensor configured to:
        receive at least a portion of an aerial image corresponding to a projected image projected by projection optics, wherein the aerial image is disposed between the projection optics and a reference surface selected from the group consisting of a surface of a substrate and a surface of a coating on the substrate;
        detect sagittal and tangential foci of at least a portion of the aerial image; and
        transmit first data based at least in part on the sagittal and tangential foci; and
    a processor operably coupled to the aerial image sensor, wherein the processor is configured to:
        receive the first data;
        estimate a field curvature of the aerial image based at least in part on the first data; and
        estimate a field curvature of the projected image based in least in part on the estimated field curvature of the aerial image.

7. The apparatus of claim 6, further comprising:
    a metrology plate, wherein the aerial image sensor is disposed on the metrology plate;
    a substrate stage disposed such that the metrology plate is disposed between the projection optics and the substrate stage, wherein the substrate stage is configured to hold the substrate; and
    a servo operably coupled to the processor.

8. The apparatus of claim 7, wherein:
    the processor is further configured to:
        determine a best fit image plane based at least in part on the first data; and
        transmit second data based at least in part on the best fit image plane; and
    the servo is configured to:
        receive the second data; and
        based at least in part on the second data, adjust a position of the best fit image plane with respect to the reference surface.

9. The apparatus of claim 8, wherein the servo is further configured to:
    based at least in part on the second data, adjust the position of the best fit image plane with respect to the reference surface by moving at least one of the best fit image plane or the substrate stage.

10. The apparatus of claim 6, wherein:
    the reference surface is the surface of the coating on the substrate; and
    the aerial image sensor is configured to detect sagittal and tangential foci during exposure of the surface of the coating on the substrate in a photolithographic process.

11. A method for controlling a focus of a projected image, the method comprising the steps of:
    detecting, at a first time instant, first sagittal and tangential foci of at least a portion of an aerial image corresponding to the projected image, wherein the aerial image is disposed between projection optics and a reference surface selected from the group consisting of a surface of a substrate and a surface of a coating on the substrate;
    estimating a first field curvature of the aerial image based at least in part on the first sagittal and tangential foci;
    determining a first best fit image plane based at least in part on the first field curvature; and adjusting a position of the first best fit image plane with respect to the reference surface.

12. The method of claim 11, wherein the step of adjusting a position of the first best fit image plane with respect to the reference surface comprises the step of moving at least one of the first best fit image plane or the substrate.

13. The method of claim 11, wherein:
the reference surface is the surface of the coating on the substrate; and
the step of detecting, at a first time instant, first sagittal and tangential foci occurs during exposure of the surface of the coating on the substrate in a photolithographic process.

14. The method of claim 11, further comprising the steps of:
detecting, at a second time instant, second sagittal and tangential foci of at least a portion of the aerial image;
determining whether a change in sagittal and tangential foci has occurred, wherein the change in sagittal and tangential foci is based at least in part on the second sagittal and tangential foci and the first sagittal and tangential foci;
upon determining that a change in sagittal and tangential foci has occurred, determining whether the change in sagittal and tangential foci corresponds to a change in pure focus or to a change in astigmatism;
upon determining that the change in sagittal and tangential foci corresponds to a change in pure focus, re-adjusting the position of the first best fit image plane with respect to the reference surface; and
upon determining that the change in sagittal and tangential foci corresponds to a change in astigmatism:
estimating a second field curvature of the aerial image based at least in part on the second sagittal and tangential foci;
determining a second best fit image plane based at least in part on the second field curvature; and
adjusting a position of the second best fit image plane with respect to the reference surface.

15. An apparatus comprising:
an aerial image sensor configured to:
receive at least a portion of an aerial image corresponding to a projected image projected by projection optics, wherein the aerial image is disposed between the projection optics and a reference surface selected from the group consisting of a surface of a substrate and a surface of a coating on the substrate;
detect, at a first time instant, first sagittal and tangential foci of at least a portion of the aerial image; and
transmit first data based at least in part on the first sagittal and tangential foci; and
a processor operably coupled to the aerial image sensor, wherein the processor is configured to:
receive the first data;
estimate a first field curvature of the aerial image based at least in part on the first data; and
estimate a first field curvature of the projected image based at least in part on the first estimated field curvature of the aerial image.

16. The apparatus of claim 15, further comprising:
a metrology plate, wherein the aerial sensor is disposed on the metrology plate;
a substrate stage disposed such that the metrology plate is disposed between the projection optics and the substrate stage, wherein the substrate stage is configured to hold the substrate; and
a servo operably coupled to the processor.

17. The apparatus of claim 16, wherein:
the processor is further configured to:
determine a first best fit image plane based at least in part on the first data; and
transmit second data based at least in part on the first best fit image plane; and
the servo is configured to:
receive the second data; and
based at least in part on the second data, adjust a position of the first best fit image plane with respect to the reference surface.

18. The apparatus of claim 17, wherein the servo is further configured to:
based at least in part on the second data, adjust the position of the first best fit image plane with respect to the reference surface by moving at least one of the first best fit image plane or the substrate stage.

19. The apparatus of claim 17, wherein:
the aerial image sensor is further configured to:
detect, at a second time instant, second sagittal and tangential foci of at least a portion of the aerial image; and
transmit third data based at least in part on the second sagittal and tangential foci;
the processor is further configured to:
receive the third data;
based at least in part on the first data and the third data, determine whether a change in sagittal and tangential foci has occurred;
upon determining that a change in sagittal and tangential foci has occurred, determine whether the change in sagittal and tangential foci corresponds to a change in pure focus or to a change in astigmatism;
upon determining that the change in sagittal and tangential foci corresponds to a change in pure focus, transmit fourth data based at least in part on the change in pure focus; and
upon determining that the change in sagittal and tangential foci corresponds to a change in astigmatism:
estimate a second field curvature of the aerial image based at least in part on the third data;
determine a second best fit image plane based at least in part on the second field curvature; and
transmit fifth data based at least in part on the second best fit image plane; and
the servo is further configured to:
receive the fourth data from the processor;
based at least in part on the fourth data, re-adjust the position of the first best fit image plane with respect to the reference surface;
receive the fifth data from the processor; and
based at least in part on the fifth data, adjust the position of the second best fit image plane with respect to the reference surface.

20. The apparatus of claim 19, wherein the servo is further configured to:
based at least in part on the fifth data, adjust the position of the second best fit image plane with respect to the reference surface by moving at least one of the second best fit image plane or the substrate stage.

21. The apparatus of claim 15, wherein:
the reference surface is the surface of the coating on the substrate; and
the aerial image sensor is configured to detect first sagittal and tangential foci during exposure of the surface of the coating on the substrate in a photolithographic process.

* * * * *